(12) United States Patent
Pollard

(10) Patent No.: US 6,433,362 B1
(45) Date of Patent: Aug. 13, 2002

(54) SEMICONDUCTOR DEVICE WITH INSULATING AND TRANSPARENT ORIGINAL SUBSTRATE

(75) Inventor: J. Pollard, Villebon sur Yvette (FR)

(73) Assignee: Opsis, Villebon sur Yvette (FR)

( * ) Notice: Subject to any disclaimer, the term of this patent is extended or adjusted under 35 U.S.C. 154(b) by 0 days.

(21) Appl. No.: 09/509,475

(22) PCT Filed: Jul. 26, 1999

(86) PCT No.: PCT/FR99/01831

§ 371 (c)(1),
(2), (4) Date: Mar. 28, 2000

(87) PCT Pub. No.: WO00/07243

PCT Pub. Date: Feb. 10, 2000

(30) Foreign Application Priority Data

Jul. 28, 1998  (FR) .......................................... 98 09662

(51) Int. Cl.⁷ .............................................. H01L 29/74
(52) U.S. Cl. ............................ 257/59; 257/50; 257/52; 257/57; 345/87
(58) Field of Search ............................ 257/59, 50, 52, 257/57; 345/87, 207; 216/23, 33; 438/164, 149, 128

(56) References Cited

U.S. PATENT DOCUMENTS

| | | | | |
|---|---|---|---|---|
| 3,701,249 A | * | 10/1972 | Bergey et al. ................. | 368/84 |
| 5,491,571 A | * | 2/1996 | Williams et al. ............... | 359/59 |
| 5,511,234 A | * | 4/1996 | Ha ............................... | 455/127 |
| 5,599,734 A | * | 2/1997 | Byun et al. ................... | 437/164 |
| 5,637,187 A | * | 6/1997 | Takasu et al. ................. | 438/30 |
| 5,815,126 A | * | 9/1998 | Fan et al. ........................ | 345/8 |
| 6,187,605 B1 | * | 2/2001 | Takasu et al. ................. | 438/29 |

FOREIGN PATENT DOCUMENTS

| | | |
|---|---|---|
| EP | 0 474 474 A2 | 3/1992 |
| EP | 0 553 860 A2 | 8/1993 |
| JP | 01039733 A | 2/1989 |

OTHER PUBLICATIONS

L.J. Spangler et al., "A Bulk Silicon SOI Process for Active Integrated Sensors," 8253a Sensors and Actuators—A Physical A24 (1990) Jul., No. 2, pp. 117–122.

* cited by examiner

Primary Examiner—Minh Loan Tran
Assistant Examiner—Thomas L. Dickey
(74) Attorney, Agent, or Firm—Young & Thompson

(57) ABSTRACT

The invention concerns an integrated circuit or chip comprising an original support and active and passive microscopic functional elements present in a thin layer made of a monocrystalline semiconductor material. The invention is characterised in that the original support (1) is refractory and transparent, and is coated on one of its surfaces with a thin layer (3) of transparent and insulating inorganic refractory material, said thin layer (3) being itself coated with a thin layer (4) of monocrystalline inorganic semiconductor material, in particular of the silicon or silicon-germanium type, which contains the active functional elements (13–14) and which supports the transparent passive functional elements (15 and 16), other opaque functional elements (17 and 18) being punctually arranged to leave out the transparent cells (12) through which the visible spectrum light can freely pass through the chip entirely.

12 Claims, 4 Drawing Sheets

SEMICONDUCTOR DEVICE WITH INSULATING AND TRANSPARENT ORIGINAL SUBSTRATE

Integrated circuits or "chips" have innumerable applications and constitute components which are more or less commonplace depending on the envisaged applications.

A chip is, in itself, a complex assembly formed of several parts, in particular a basic substrate on which the microscopic active and passive components are organised in large numbers and which provide the chip with its functional characteristics.

It is understood, however, that the substrate is not unimportant and that its physical and chemical characteristics are determinant, at least for certain applications.

In the following text, the expression "original substrate" is used to denote the substrate, its composition and its structure, such as it exists before the first manufacturing steps relating more specifically to the microscopic active and passive components of the chip.

The present invention relates, as will be seen below in detail, equally well to the original substrate, to the chip and to the devices with which such a chip can be associated, because of the characteristics which they procure for these devices.

Chips are already known whose microscopic active and passive elements are produced by semiconductor manufacturing processes considered as standard, using high temperatures, of the order of 1,100° C., which demand, obviously, that the structure should be compatible with these severe thermal stresses, which is the case of monocrystalline semiconductor substrates, of the silicon type having a thickness of at least 400 $\mu$m (micrometres).

This structure is by far the most widespread because it allows chips to cover virtually all electronic applications: microprocessors, memories, etc.

On the other hand, these chips cannot be used in applications which assume that they can be traversed by light because of the fact that the original substrate is not transparent (at least not in the visible spectrum).

Similarly, as the original substrate is, by nature, a semiconductor, it is not insulating and is inappropriate for applications necessitating high frequencies (high frequencies or ultrahigh frequencies) which require a perfect insulation of the functional elements associated with the substrate.

Chips are also known which are manufactured at these high temperatures, but using specific processes which are non-standard and therefore costly, from original substrates comprising a very thin layer (of few fractions of a $\mu$m) of monocrystalline silicon semiconductor associated by crystalline growth (epitaxy) on a transparent monocrystalline insulating substrate of the sapphire or corundum type.

Unfortunately, faults are introduced in the epitaxially grown thin layer which results in a detectable reduction in the performance expected from the functional elements.

The original substrate is very expensive and its cost, added to that of the non-standard use, results in prices for the chips produced in this way which are prohibitive for the envisaged applications. In fact, these chips have prominent qualities with regard to their resistance to radiation and their applications are, in practice, restricted to the nuclear field and to the space field which accept high prices because the essential purpose is to achieve the sought goal and not to restrict the cost price, which is obviously not the case in commercial areas in competitive markets.

Certain non-standard manufacturing processes require temperatures lower than those mentioned above, namely less than 600° C., which makes it possible to adopt other structures, particularly a very thin layer (a few fractions of a $\mu$m) of amorphous or polycrystalline silicon semiconductor deposited chemically in the vapour phase on a transparent insulating silica or glass substrate.

The active elements formed in an amorphous or polycrystalline material are very slow and totally inappropriate for circuits operating in high frequency logic or ultrahigh frequency analogue applications. Optoelectronic devices of known type such as active matrix liquid crystal screens cannot be manufactured in this way in the form of a chip integrating all the screen addressing functions.

There are also semiconductor chips comprising a semiconductor substrate upon which the functional elements are fixed with the interposition of an insulating layer but this layer is too thin to procure a genuine insulation at high frequency and at ultrahigh frequency, because it is only a few $\mu$m thick, or even only a few fractions of a $\mu$m, which cannot be compared with what an insulating substrate of several hundred $\mu$m would be.

There are also semiconductors whose structure comprises on the one hand a thin layer (a few fractions of a $\mu$m) of a monocrystalline semiconductor of the silicon type and comprising the very numerous functional elements, and on the other hand a thin insulating layer, this assembly being originally integrated on the surface of a monocrystalline silicon support in order to create a standard non-insulating non-transparent type substrate, known by the abbreviation SOI (Semiconductor On Insulator).

Then, by a complete post-process, this assembly is detached from its original substrate and is then transferred and fixed to another thick (400 $\mu$m and more) final insulating and transparent support, by means of an organic adhesive;

After obtaining the actual functional elements according to a standard process, it is necessary to use this post-process according to the following phases:

a) stick the front of the two thin layers on one face of a flat handling dummy, using a temporary glue, b) mechanically thin down the original opaque support, by removing material in order to eliminate it from the side remote from the dummy, c) after mechanical thinning, eliminate what remains of this original opaque support by physical-chemical means, until the thin insulating layer is revealed, d) glue this thin insulating layer on a final insulating and transparent support, generally made of glass or silica, using an organic, insulating and transparent organic adhesive (which could not withstand the high temperature necessary for the manufacture of the functional elements), e) remove the dummy by unsticking it from the two thin layers.

According to a variant of the post-processing, a dummy is not used but a final insulating and transparent support is used directly, the initial opaque one is thinned and it is removed so that, finally, the assembly of the two thin layers is fixed to the second insulating and transparent support by its face which is generally the external face. This post-processing is very complex and difficult to automate, which results in high cost prices.

The present invention proposes a new solution making it possible to produce chips on an original substrate of the low-cost SOI type, having an insulating and transparent support and whose structure allows the use of standard manufacturing processes.

To this end, the invention relates to an integrated circuit device or "chip", of the type comprising an original support and microscopic active and passive functional elements present in a thin layer of monocrystalline semiconductor material, characterised in that the original support is refractory and transparent and is covered on one of its faces with a thin layer of transparent and insulating inorganic refractory material, this thin layer itself being covered with a thin layer of inorganic monocrystalline semiconductor material, in particular of the silicon or silicon-germanium type, which contains the active functional elements and which supports the transparent passive functional elements, other opaque functional elements being punctually arranged to allow transparent cells to remain, through which light of the visible spectrum can freely pass through the entire chip.

According to other characteristics of the invention:

the original support is made of refractory glass;

the glass has a coefficient of expansion adapted to that of the thin layer of semiconductor material;

the original support is covered on all of its faces with a refractory and transparent layer having a barrier effect with respect to certain chemical elements present in the support, in order to confine them therein;

the original support carries an opaque layer on its face which is remote from the one carrying the semiconductor layer;

the semiconductor layer is formed of monocrystalline silicon or silicon-germanium whose thickness is sufficiently thin that the said layer is transparent;

microelectronic elements such as transistors are disposed on the periphery of the transparent zones;

liquid crystals are integrated with a thin material, in order to constitute a unit structure interposed between the chip itself and a transparent counter-electrode formed by a thin layer applied against a transparent window, this assembly constituting a transmissive screen-chip;

the device is associated with lighting means situated on the side remote from that through which it must be observed, either directly or by projection;

the device is integrated with an apparatus such as a portable radio-telephone;

the device constitutes a detachable plug-in assembly provided with devices for connection to an apparatus such as a radio-telephone;

the device is associated with a spectacle frame, at the rate of one for each eye in a symmetrical and axial but not central arrangement;

the device is associated with a mini-projector with a screen having a decimetric surface area.

The invention will be better understood from the detailed description hereafter given with reference to the attached drawing. The description and the drawing are of course given as indicative and non-limitative example.

In order to be able to produce a device according to the invention, it is necessary to have available a substrate which in some way constitutes its core and which must be obtained by standard manufacturing means in order to be offered at affordable prices. Such a substrate does not exist at present.

Depending on the material chosen for each of the parts forming a substrate (including its support) and depending on the process used to associate them, results are obtained which differ from one another with respect to the following parameters:

transparency or opacity of the substrate, absence or presence of optical aberrations, absence or presence of parasitic capacitances for the functional elements, zero, poor or excellent electrical insulation, greater or lesser mechanical ruggedness, standard or specific manufacturing, high or reasonable cost price.

Figure 1:
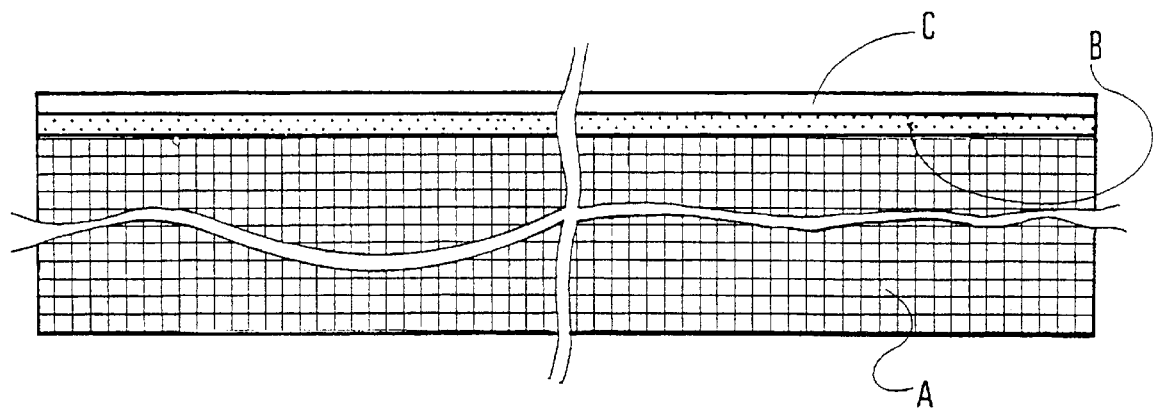
FIG. 1 is a diagrammatic cross-sectional view of an original SOI substrate of known type comprising a thin layer of a monocrystalline semiconductor product fixed to a thin inorganic insulating layer, the whole being integrated with the surface of a thick support of opaque monocrystalline silicon.

Referring to FIG. 1, there can be seen an SOI substrate of existing type formed from three elementary parts, namely a support A which is thick because it must be mechanically robust, but opaque and non-insulating, a thin inorganic insulating layer B and a thin layer C of an inorganic monocrystalline semiconductor material, generally of silicon, in which the microscopic functional elements of the chip are created.

As was shown in the preamble of the present description, none of the known substrates positively meet the following cumulative requirements:

transparency of the substrate, absence of optical aberrations, absence of parasitic capacitances for the functional elements, excellent electrical insulation, good mechanical ruggedness, standard manufacturing, reasonable cost price,
because some of these substrates are obtained only at prohibitive cost, others are not transparent or have poor insulation qualities, etc.

In order to obtain both a substrate which withstands high temperatures and transparent chips, the starting point is the SOI substrate of FIG. 1 and the semiconductor layer C is worked at high temperature in order to create functional elements E therein.

After manufacture of the elements E, the original opaque and non-insulating support A is removed until the insulating layer B is completely cleared, then the insulating layer B and the worked layer C, are together applied onto a transparent and insulating support G, with the interposition of an organic adhesive layer H which would be incapable of withstanding the high temperature of the manufacturing process used for the functional elements E.

Figure 2:
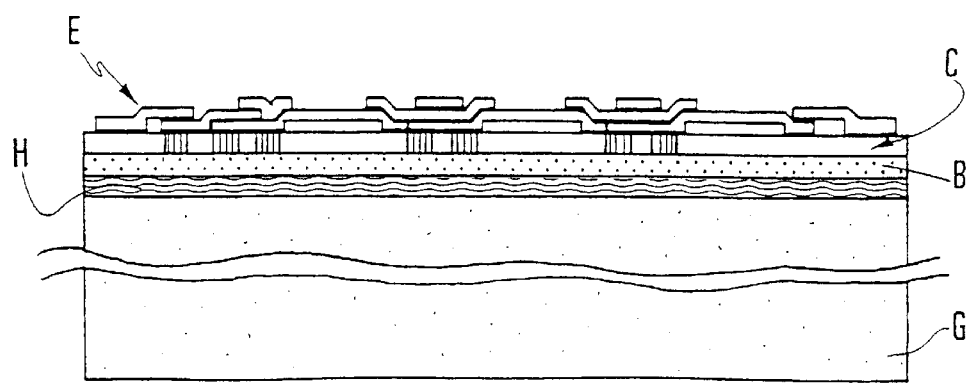
FIG. 2 is a diagrammatic cross-sectional view of a chip of known type, made from the original substrate of FIG. 1, after removal of the original opaque non-insulating support and transfer onto a final transparent insulating support.

In this way the structure shown in FIG. 2 is achieved.

The invention makes it possible, precisely, to meet all of these requirements simultaneously, despite the incompatibilities acknowledged as such by those skilled in the art.

One of the conditions to be met is to operate according to standard semiconductor manufacturing processes, among which it is necessary to eliminate those which combine materials with different coefficients of expansion, since the only means of overcoming this difficulty is to operate at moderate temperature (about 600° C.), which does not conform with the standard processes.

Furthermore, it is a fact that this method does not make it possible to achieve the desired objectives, such that it is necessary to use a process making use of a high temperature (about 1,100° C.) in order to obtain high-performance functional elements in a layer of inorganic and monocrystalline semiconductor material.

Substrates manufactured by such processes must meet very severe requirements. One of these requirements is the absolute necessity that they do not release any trace, even infinitesimal, of ions of certain elements, namely those which are grouped in columns Ia, IIa, IIIa and Va of Mendeleev's Periodic Table of Chemical Elements.

In order to constitute the support, it would therefore be possible to use quartz, which is formed only of silicon and oxygen but the coefficient of expansion of quartz is truly very different from that of the inorganic and monocrystalline semiconductor materials in thin layers.

When the substrate must be transparent and, furthermore, have a coefficient of expansion equal to that of the monocrystalline semiconductor thin layer, the most suitable material is a glass whose artificial production makes it possible to adjust its coefficient of expansion and which is transparent by nature, whereas a finished natural element, such as sapphire, has a given and non-modifiable coefficient of expansion.

When there is a risk of such a glass releasing undesirable ions, it is necessary to apply a barrier layer thereto.

Another requirement of standard manufacturing processes derives from the automatic devices used among which are included detection and marking operations. As standard substrates are opaque, the manufacturing robots are designed to use this property, such that a transparent substrate would require the construction of special machines.

The invention necessitates that the original substrate should be transparent, that it should carry a monocrystalline semiconductor layer and an effective insulator and that it should be mechanically robust, the whole being obtained by standard processes and without it being necessary to complete the actual manufacture with complex, difficult and costly post-processing and finishing operations. Once the support 1 made of special glass is completed, the original substrate is created by a standard process of the already mentioned SOI type and therefore comprises (FIG. 3):

the support 1 made of special refractory glass,
a thin continuous layer 2 of transparent material, having a barrier effect with regard to undesirable ions possibly released by the glass of the support 1, which covers both faces and the edge of the slice of the support 1 in order to clad it completely,
a thin intermediate layer 3 of insulating and transparent inorganic material,
a thin upper layer 4 of a monocrystalline and inorganic semiconductor material,
a lower layer 5 of optically opaque refractory material.

The support 1 comes from plates of special refractory glass having a thickness of 0.5 millimetres or more, whose coefficient of expansion is adjusted by the manufacturer to that of the layer 4 at least.

After cutting out, the plates are possibly polished in order to ensure strict parallelism and a so-called "mirror" quality surface for both of the major faces.

Then the plates are cut into disks of different diameters according to the requirements (100 millimetres and more), with finishing of the cut edges.

The insulating and transparent barrier layer 2, for example made of silicon nitride, is then deposited by physical-chemical means.

The layers 3 and 4 are put into place by a SOI process which is known per se, the insulating layer 3 being intimately bonded to the barrier layer 2 by molecular bonding of the said SOI process. Finally, the opaque refractory layer 5, for example of amorphous or polycrystalline silicon, is deposited on the lower face of the support 1–2, that is to say the face remote from the subassembly 3–4, by electrochemical deposition.

The structure of the original substrate is then complete and the standard semiconductor manufacturing process can follow at high temperature for the manufacture of the microscopic functional elements of the chips.

The manufacture consists of sequencing many operations of photoetching, depositing, microlithography, etc, in order to create the active and passive functional elements, namely transistors, connections, control grids, etc, by means which are known per se and used in microelectronics.

Thus, the layer 4 comprises all of the microelectronics in an extremely thin thickness of the order of 1.5 $\mu$m, at which the silicon is transparent, it being recalled that silicon can be removed selectively, in particular during an etching operation.

Figure 3:
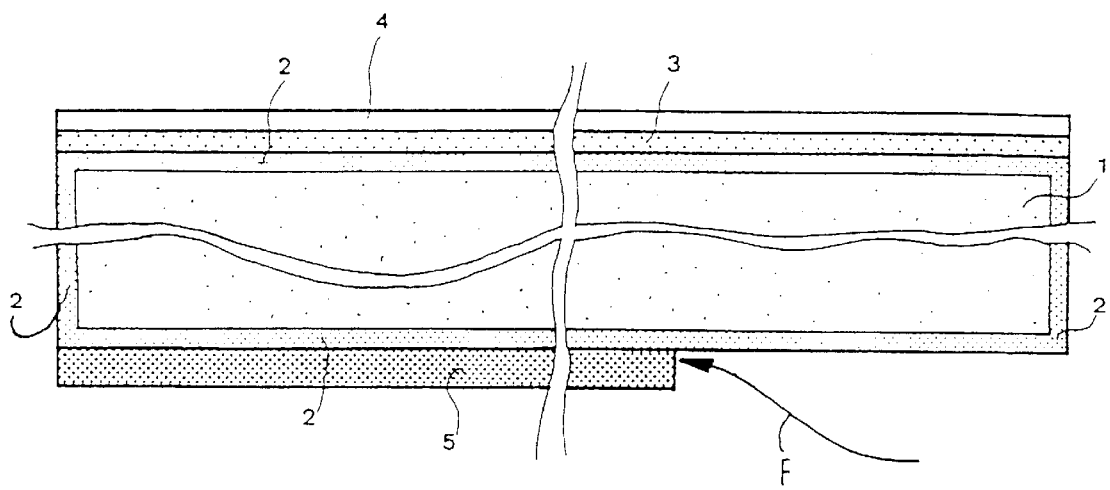
FIG. 3 is a diagrammatic cross-sectional view of a substrate according to the invention, suitable for standard semiconductor manufacturing processes and having specific qualities.
Figure 4:
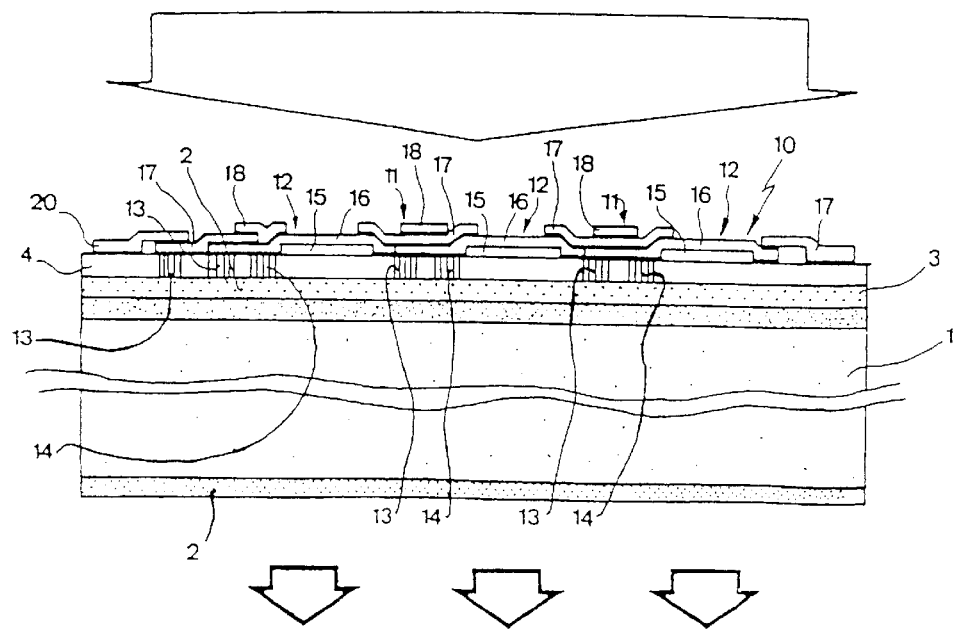
FIG. 4 is a diagrammatic cross-sectional view of an integrated circuit, or chip, according to the invention, after the production of the active and passive functional elements, showing the presence of transparent zones allowing the transmission of light.

In FIG. 4 the structure produced after working the layer 4 can be seen, which comes from the original substrate of FIG. 3.

The chip exhibits on its upper face a matrix given the general reference 10, and formed of opaque rows and columns 11, determining transparent zones 12 between them. In the monocrystalline semiconductor layer 4 there are microscopic active elements 13 and 14. Insulating elements or passive semiconductors 15 and 16 are located opposite the transparent zones 12. Finally, passive elements 17 and 18 are found in rows and columns.

When all of the operations are completed and when the opacity of the substrate has become useless, the temporary opaque layer 5 is removed, as indicated by the arrow F in FIG. 3, in order to eliminate it.

After removal of the opaque layer 5, a chip is available which constitutes a complete component containing all of the control elements necessary for its operation and which is totally transparent. The thickness of this chip is about 0.5 millimetre.

It can thus be seen that the invention has the important result of allowing the production of all of the logic, the connecting system and the desired controls on a single chip whose manufacture remains compatible with existing processes.

It should be noted that the transistors are placed on the periphery of each transparent zone, so that they do not interfere with the free transmission of light and the chip is correctly transmissive. Each transparent zone 12 and its peripheral functional elements together constitute a cell.

At each line-column crossing there is a microscopic active element 13–14 for controlling each cell, in each of which there is also an individual transparent electrode 15.

At the periphery of the matrix 10 are located the control circuits for the active elements and beyond that are the contacts 20 for connecting the chip to the electronic circuit of the equipped apparatus. It may be thought that technological development will make it possible to reduce the pitch of the cells, which is currently 15 $\mu$m, by up to a factor of 10, that is to say that, according to this assumption, a given area would have 10×10=100 times more cells providing a greatly improved image resolution.

In order to produce a screen-chip, the previously described chip must be associated with a liquid crystal and the transparent zones 12 constitute an equal number of pixels called "transmissive pixels".

According to the invention, the liquid crystal is integrated with a structure a few microns (micrometres) thick, which makes it possible to be rid of many inherent disadvantages of the current technology. In particular, it is not necessary to have an anchoring layer in order to orientate the crystals and there is no longer any need for polarisers in order to control the transmission/occultation of light.

Figure 5:
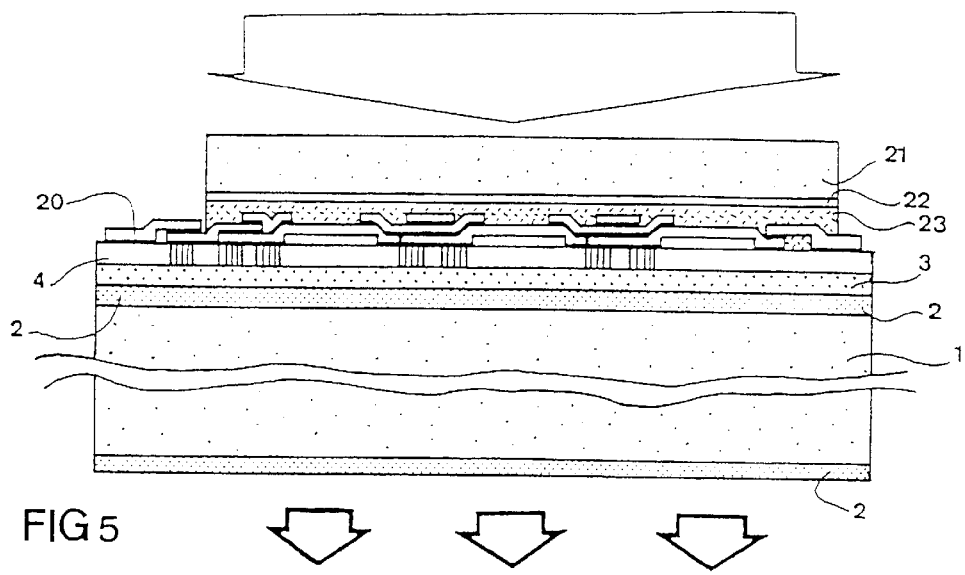
FIG. 5 is a diagrammatic cross-sectional view showing an optoelectronic component, of the transmissive screen-chip type, essentially comprising a chip according to the invention.

Referring now to FIG. 5, it can be seen that the chip of FIG. 4 is completed by a glass window 21, provided with a transparent counter-electrode 22, the structure 23 containing the liquid crystal being interposed between the counter-electrode 22 and the actual chip.

The counter-electrode 22 makes it possible to maintain the reference potential for establishing an electric field through the structure 23 containing the liquid crystal. This counter-electrode 22 is made from indium-tin oxide which is a conducting and transparent material.

The characteristics of the transmitted light are controlled at each transmissive pixel 12 by means of variations of an electric field generated between the transparent electrode 15 of each transmissive pixel 12 and the counter-electrode 22, according to the control signals arriving at the chip through its connection contacts 20.

Figure 6:
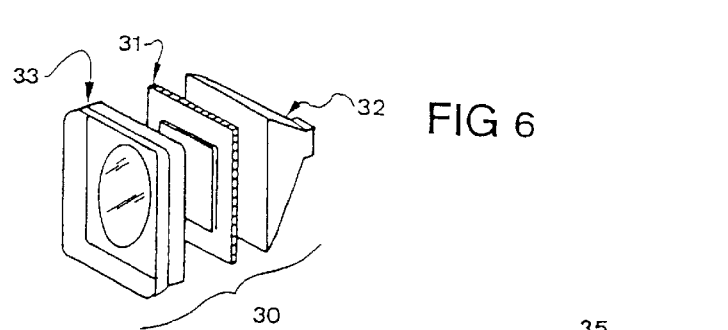
FIG. 6 is a diagrammatic view of a complete micro-screen, composed of a transmissive screen-chip, a lighting device and viewing optics.

In FIG. 6 it can be seen that a complete component constituting a micro-screen 30 based on the screen-chip of FIG. 5, denoted by the overall reference 31, is placed between a rear lighting device 32 and frontal optics 33. This is revealed thanks to the component being shown in an exploded view.

The lighting device 32 is itself composed of one or more light emitting diodes and of collimating optics (not visible in the drawing) and provides a monochromatic or trichromatic light, depending on whether it is desired to obtain black and white images or colour images.

The frontal optics are more or less complex but essentially comprise a magnifying viewer.

Suitably controlled by control electronics, the screen-chip 31 can offer the observer still or animated images, in black and white or in colour of excellent quality, given the very large number of transmissive pixels 12 which allow very good resolution and a very good clarity of detail of the image.

The possibility of animation of images and the presence of colours depend on the reaction speed of the electro-optical material (liquid crystals). Colour animation requires higher speed than black and white animation and, a fortiori, than still images.

It is understood that, for an observer who brings his eye close to the optics 33, the screen-chip 31, illuminated by transparency, produces a virtual image (in the optical sense of the term) which is equivalent to that of a large screen observed from afar.

Depending on the selected optics 33, the apparent distance from this large virtual screen (in the common sense of the term) can be established between a few decimetres and infinity.

Since all of the light produced by the rear lighting device 32 is transmitted to the retina of the observer's eye, the lighting power can remain very low, which is precisely a great advantage in the field of miniaturisation. In fact, the micro-screen 30 can be very small, 1 to 3 cm$^3$ for example, thanks to the harmonious distribution of the elements complementary to the screen-chip 31, on either side of the latter. It can be pointed out that a screen-chip of known type which is non-transparent and which cannot transmit light but which reflects it (the chip is then called "reflective"), makes it obligatory to place the lighting device and the viewing optics on the same side of the reflective chip, which necessarily results in a less compact and more voluminous construction.

Figure 7:
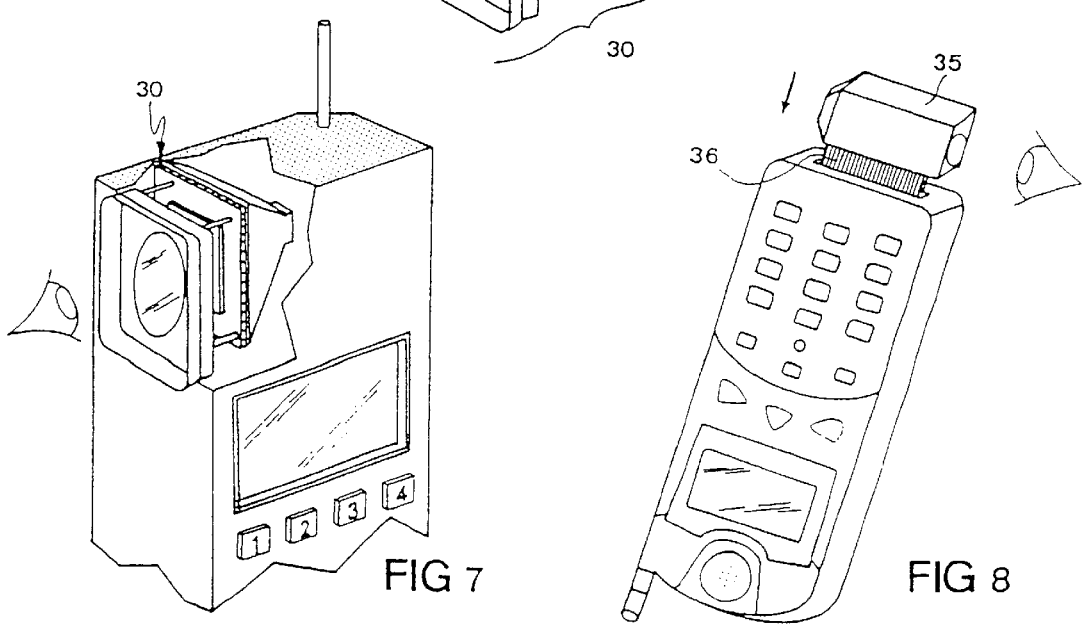
FIG. 7 is a diagrammatic view showing integration of the micro-screen of FIG. 6 in a portable radio-telephone.

Referring to FIG. 7, the micro-screen of FIG. 6 can be seen integrated with an apparatus which, in this case, is a portable radio-telephone.

This integration therefore assumes that the apparatus is designed from the beginning with the micro-screen 30 and its electronic logic.

Figure 8:
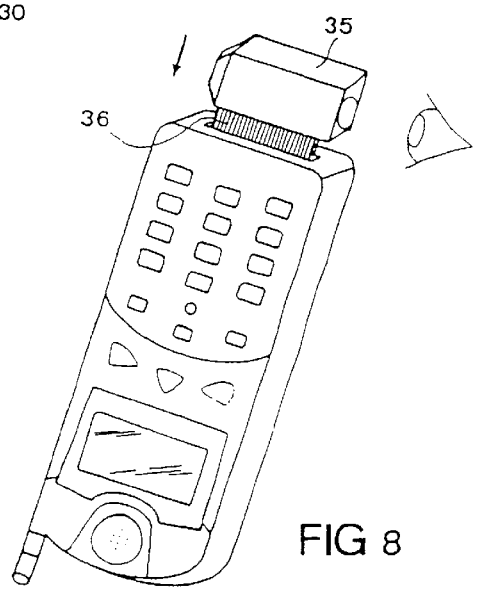
FIG. 8 is a diagrammatic view showing integration of the micro-screen of FIG. 6 in a small independent casing, provided with connecting pins and capable of being plugged into a port of an apparatus which, in this case, is a portable radio-telephone.

In FIG. 8 there can be seen another solution which consists in placing the micro-screen 30 in a small independent casing 35 provided with pins 36 of the standardised type to allow the casing 35 to be plugged into a port which is itself standardised, provided in this case on a portable radio-telephone.

In this way, the casing 35 is detachable and can be connected or not connected to one or more different apparatuses which can be of any type provided they have a port compatible with the pins 36.

The modest size and the low energy consumption of the micro-screen 30 allow its association with compact and portable apparatuses, in particular with digital radio-telephones which can easily allow distant connections, which gives the user the ability to connect with systems of the INTERNET type, with systems of the MINITEL type or with all sorts of databases since it is the radio-telephone which receives the digital signals generating the images displayed on the screen-chip.

Figure 9:
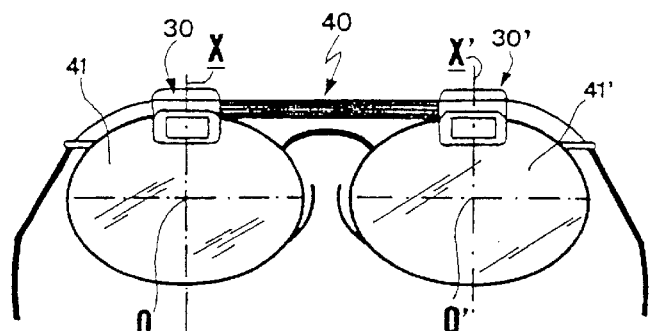
FIGS. 9 and 10 are diagrammatic views illustrating the association of two micro-screens according to the invention with spectacles.
Figure 10:
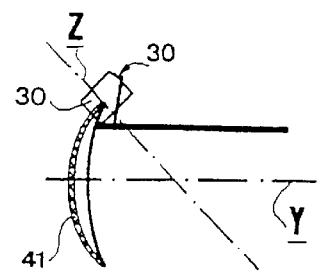

Because of these same qualities of minimal size and energy consumption, it is possible, as shown in FIGS. 9 and 10, to place a micro-screen 30–30' on a light spectacle frame 40 on the top part and in the axis x–x' of each of the two lenses 41 and 41', but not at their centres 0–0', in order not to interfere with the normal vision of the user.

In this way, the central, left, right and bottom zones are entirely clear, which allows normal binocular vision. The lenses 41–41' can furthermore be of plain glass without optical correction.

The axis z of each micro-screen 30–30' is inclined with respect to the axis of normal vision y, which is assumed to be horizontal, in order to converge with the vision axis y substantially on the pupil of the user's eyes, so that the user can, simply by raising his eyes, observe the two micro-screens 30 and 30' and benefit from the images he wishes to observe, without losing warning peripheral vision thanks to which he can immediately resume his normal vision in case of necessity by lowering his eyes to their desired position.

Naturally, the micro-screens 30 and 30' must be connected to an electronic logic, which can be obtained by attaching a wired connection to them or by providing them with microwave or infrared radiation receivers.

Figure 11:
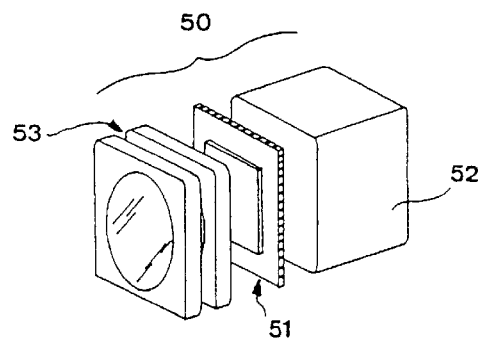
FIG. 11 is a diagrammatic view of a micro-projection assembly according to the invention, based on a transmissive screen-chip according to the invention.

FIG. 11 is an exploded view which illustrates a variant according to which the transmissive chip, given the overall reference 51, is associated with a projection device 50.

A rear lighting device 52 must be more powerful than the device 32. Frontal optics 53, entirely different from the viewer of FIG. 6, comprise light projection means.

Figure 12:
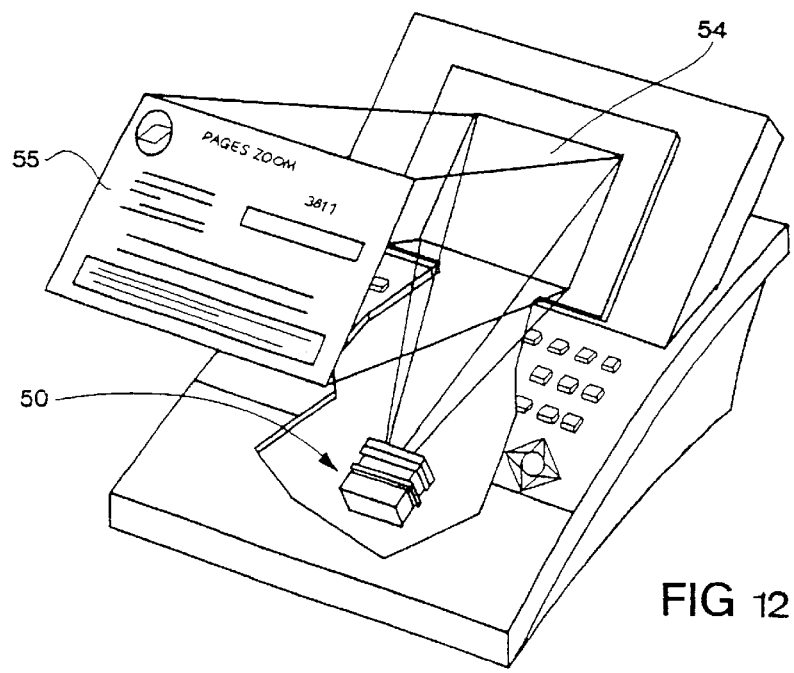
FIG. 12 is a diagrammatic view of a micro-projector integrating the assembly of FIG. 10 and allowing projection of the image originating in the screen-chip onto a direct display screen having larger dimensions.

The projector 50 can be integrated with a complete assembly such as the one illustrated in FIG. 12 which shows that the images formed on the screen chip 31 are projected and reflected by return optics 54 and finally arrive at a direct viewing screen 55.

This screen 55 can have an area of a few square decimetres, for example the normal format of portable computer screens.

This projection assembly is much more advantageous and more economic than the known screens constituted by bulky cathode ray tubes or by costly flat screens.

It is understood that the invention covers the glass support, the original substrate, the chip, the chip-screen, the micro-screen and any device with which these elements can be integrated.

In practice, the assembly of FIG. 6 constitutes a complete component capable of being marketed as it is but the screen-chip in itself, the chip, the structure of the liquid crystal and the substrate in itself constitute separate parts which can be marketed separately in such a way that the invention covers each and every one of these elements considered alone or in any combination.

Furthermore, it clearly emerges from the above description that all of these elements are used together in the production of more complex apparatuses which they provide with hitherto unknown performance.

Many applications other than those described are of course possible, since the micro-screen provides exactly the same services as a common screen whilst being highly miniaturised.

What is claimed is:

1. An integrated circuit device comprising:

an original support, said original support being a refractory material and being electrically insulating and transparent;

a thin layer of inorganic monocrystalline semiconductor material comprising silicon over said original support;

active functional elements contained in said thin layer;

transparent passive functional elements supported by said thin layer;

opaque functional elements being punctually arranged over said thin layer to allow transparent cells to remain, light of the visible spectrum can freely pass through the entire integrated circuit, through said transparent cells; and a thin layer of transparent and electrically insulating, inorganic refractory material interposed between said original support and said thin layer of inorganic monocrystalline semiconductor material;

wherein said original support has a coefficient of thermal expansion which is substantially equal to a thermal expansion coefficient of said thin layer of inorganic monocrystalline semiconductor material.

2. The device according to claim 1 wherein the original support is made of refractory glass.

3. The device according to claim 2 wherein the original support is covered on all respective faces with a transparent and refractory layer having a barrier effect with respect to certain chemical elements present in the support in order to confine said chemical elements therein.

4. The device according to claim 1 wherein the original support has an opaque layer on a face thereof which is remote from the semiconductor layer.

5. The device according to claim 1 wherein the semiconductor layer is sufficiently thin for said semiconductor layer to be transparent.

6. The device according to claim 1 wherein active microelectronic elements are disposed at the periphery of the transparent cells.

7. The device according to claim 1 wherein liquid crystals are integrated in a thin material in order to constitute a unit structure interposed between the integrated circuit device and a transparent counter-electrode formed by a thin layer applied against a transparent window, this assembly comprising a transmissive screen chip.

8. The device according to claim 7 wherein a lighting means is located on a side of said device that is remote from an observation side.

9. The device according to claim 7 wherein said device is integrated with a portable apparatus providing a function of a portable radio-telephone.

10. The device according to claim 7 wherein said device is in a detachable plug-in assembly provided with connecting devices for connecting to a portable apparatus providing a function of a radio-telephone.

11. The device according to claim 7 wherein said device is in a spectacle frame at the rate of one for each eye in a symmetrical and axial but non-central arrangement.

12. The device according to claim 7 wherein said device is in a mini-projector with a screen having a decimetric surface area.

* * * * *